United States Patent

Sharma et al.

(10) Patent No.: US 9,490,782 B2
(45) Date of Patent: Nov. 8, 2016

(54) LATCH CIRCUIT

(71) Applicant: NXP B.V., Eindhoven (NL)

(72) Inventors: Vibhu Sharma, Eindhoven (NL); Ajay Kapoor, Veldhoven (NL); Ralf Malzahn, Seevetal (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/527,865

(22) Filed: Oct. 30, 2014

(65) Prior Publication Data

US 2015/0123722 A1 May 7, 2015

(30) Foreign Application Priority Data

Nov. 1, 2013 (EP) .................................. 13191288

(51) Int. Cl.
| | |
|---|---|
| *H03K 3/3562* | (2006.01) |
| *H03K 3/037* | (2006.01) |
| *H03K 3/356* | (2006.01) |
| *H03K 3/012* | (2006.01) |

(52) U.S. Cl.
CPC .......... *H03K 3/35625* (2013.01); *H03K 3/012* (2013.01); *H03K 3/0372* (2013.01); *H03K 3/356104* (2013.01); *H03K 3/356156* (2013.01)

(58) Field of Classification Search
None
See application file for complete search history.

(56) References Cited

U.S. PATENT DOCUMENTS

| | | | | |
|---|---|---|---|---|
| 3,651,340 A | * | 3/1972 | Cliff | H03K 19/0013 326/121 |
| 4,584,491 A | * | 4/1986 | Ulmer | H03K 19/09482 326/103 |
| 7,187,211 B2 | | 3/2007 | Lundberg et al. | |
| 7,456,669 B2 | | 11/2008 | Teh et al. | |
| 7,479,806 B2 | | 1/2009 | Teh et al. | |
| 7,518,426 B1 | | 4/2009 | Smith | |
| 8,085,076 B2 | | 12/2011 | Djaja et al. | |
| 2002/0000834 A1 | | 1/2002 | Ooishi | |
| 2002/0130693 A1 | | 9/2002 | Kojima et al. | |
| 2003/0117933 A1 | | 6/2003 | Hsu et al. | |
| 2005/0242859 A1 | * | 11/2005 | Meltzer | H03K 3/356139 327/208 |
| 2006/0044013 A1 | | 3/2006 | Hsu et al. | |
| 2006/0267654 A1 | | 11/2006 | Gururajarao et al. | |
| 2007/0182458 A1 | | 8/2007 | Park et al. | |

(Continued)

FOREIGN PATENT DOCUMENTS

JP    S60 224319 A    11/1985

OTHER PUBLICATIONS

Teh, Chen Kong et al; "A 77% Energy-Saving 22-Transistor Single-Phase Clocking D flip-flop with Adaptive Coupling Configuration in 40nm CMPS"; ISSCC 2011, Session 19, Low-Power Digital Techniques, 19.4; IEEE International Solid State Circuits Conference; pp. 338-339 (Feb. 23, 2011).
Extended European Search Report for application 13191288.3 (Mar. 6, 2014).

*Primary Examiner* — Long Nguyen (57) ABSTRACT

A latch circuit is based on a master-slave cross-coupled inverter pair configuration. The inverters of the slave circuit are coupled to a high voltage rail and a low voltage rail, wherein for each of the two inverters of the slave circuit inverter pair, the coupling to one of the voltage rails is through a resistive element. This circuit design avoids the need for an internal clock-buffer and enables single phase clocking, and therefore does not need internal clock signal inversion. The circuit can be implemented with low power, with no dynamic power consumption for redundant transitions when the input and the output data signal is same.

8 Claims, 7 Drawing Sheets

(56) References Cited

U.S. PATENT DOCUMENTS

| | | |
|---|---|---|
| 2008/0007312 A1 | 1/2008 | Clark et al. |
| 2008/0030238 A1 | 2/2008 | Kim |
| 2009/0085627 A1 | 4/2009 | Gill et al. |
| 2010/0271866 A1 | 10/2010 | Sakimura et al. |
| 2013/0002328 A1 | 1/2013 | Oda |
| 2015/0043270 A1 | 2/2015 | Singh et al. |

* cited by examiner

LATCH CIRCUIT

The invention relates to latch circuits.

It has been recognised that clock network design is a major contributor to the total power consumption of a latch circuit.

In particular, the redundant transition of internal nodes, when the input and the output are in the same state, results in unnecessary power consumption in latch circuits, such as flip-flops. These redundant transitions can account for around 50% of the power consumption. The dynamic power consumption of clock sinks (flip flops) is generally around 30% of the total power budget of system-on-chip ("SoC") designs.

There have been several approaches adopted for reducing the power consumption of system-on-chip architectures. Clock gating has been widely used as a method for turning off the clocking of the portion of SoC designs not in use. Unfortunately, clock gating is ineffective for situations when the data sampled by the clocked element is same for the two consecutive cycles. The redundant switching of the internal nodes of a flip flop caused by the clock signal, when the input and the output nodes are in the same state, causes unnecessarily increase in the power consumption.

Figure 1:
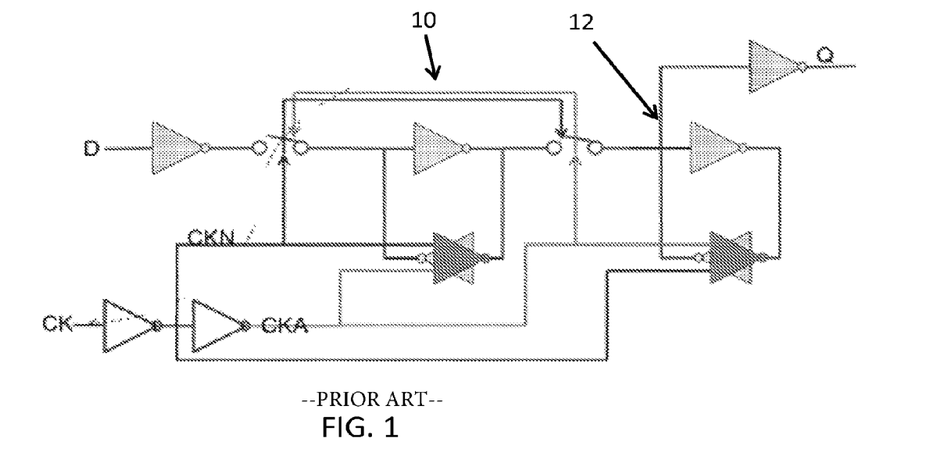
FIG. 1 shows a first known master-slave flip flop design.

FIG. 1 shows a known Master-Slave D-type flip-flop topology, showing the D input, Q output, external clock input CK and internal opposite phase clocks CKA and CKN. The circuit comprises a master gated D-type latch 10 and a slave gated D-type latch 12. The internal clock parasitic capacitance is always switched, irrespective of the difference in the values sampled for the consecutive clock cycles. This leads to an undesirable increase in the power consumption.

Several low power techniques have been proposed to reduce the power consumption caused by the redundant switching of the internal nodes of a flip flop.

Figure 2:
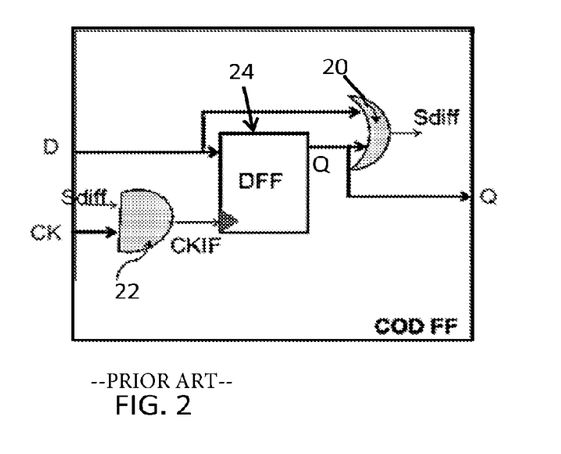
FIG. 2 shows a second known master-slave flip flop design.

FIG. 2 shows a called "clock on demand" flip-flop. This has an exclusive OR gate 20 whose output Sdiff is used to gate a clock buffer in the form of an AND gate 22 for the master/slave latch arrangement 24 to avoid redundant transitions for the same input and output values. The XOR gate compares the current D input and the latched flip flop Q output. In this way, a transparent sampling window is created only when the current input is different from the input sampled in the previous clock cycle.

This kind of microarchitecture acts as a fine tuning feature for saving clock power compared to clock gating, which acts as a more coarse control.

There is an increased power consumption, due the added functionality of the AND gate 22 and XOR gate 20, during the regular operation, namely when the input and the output data is different for consecutive clock cycles (which added power consumption is in fact 23%). This power consumption increase can be neglected considering the reduction in power consumption achieved for the same input and output data for consecutive clock cycles, which is a factor of 1.7 to 2.94.

Figure 3:
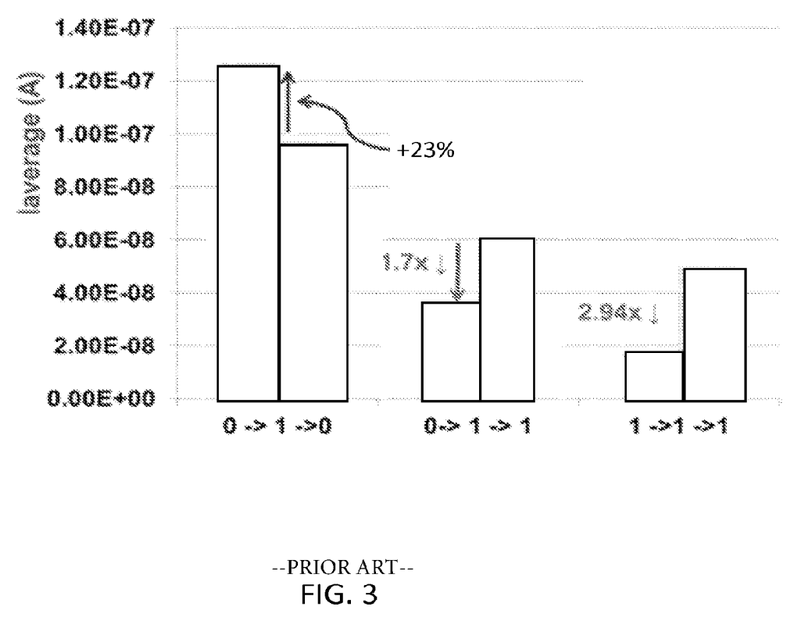
FIG. 3 shows the power saving benefits of the design of FIG. 2.

FIG. 3 shows the power consumption changes (based on current flow Iaverage). The left bars in each pair show the power consumption for the circuit of FIG. 2 and the right bars show the power consumption for the basic flip flop 24. The power consumption is shown for three possible input data sequences.

There is a problem with this circuit relating to the hold time. The clock on demand flip-flop is basically a latch circuit driven by a pulsed clock generated in the circuit by the AND operation between the Sdiff signal and the clock signal. The issue of hold time degradation is critical especially for the scan test circuits. The scan chain is a kind of shift register and the propagation delay of each segment of the chain can be small. This necessitates the insertion of delay cells into the segments of the scan chain in order to fix the hold time violations. This not only complicates the design effort but also increases the power consumption with the insertion of delay cells.

Figure 4:
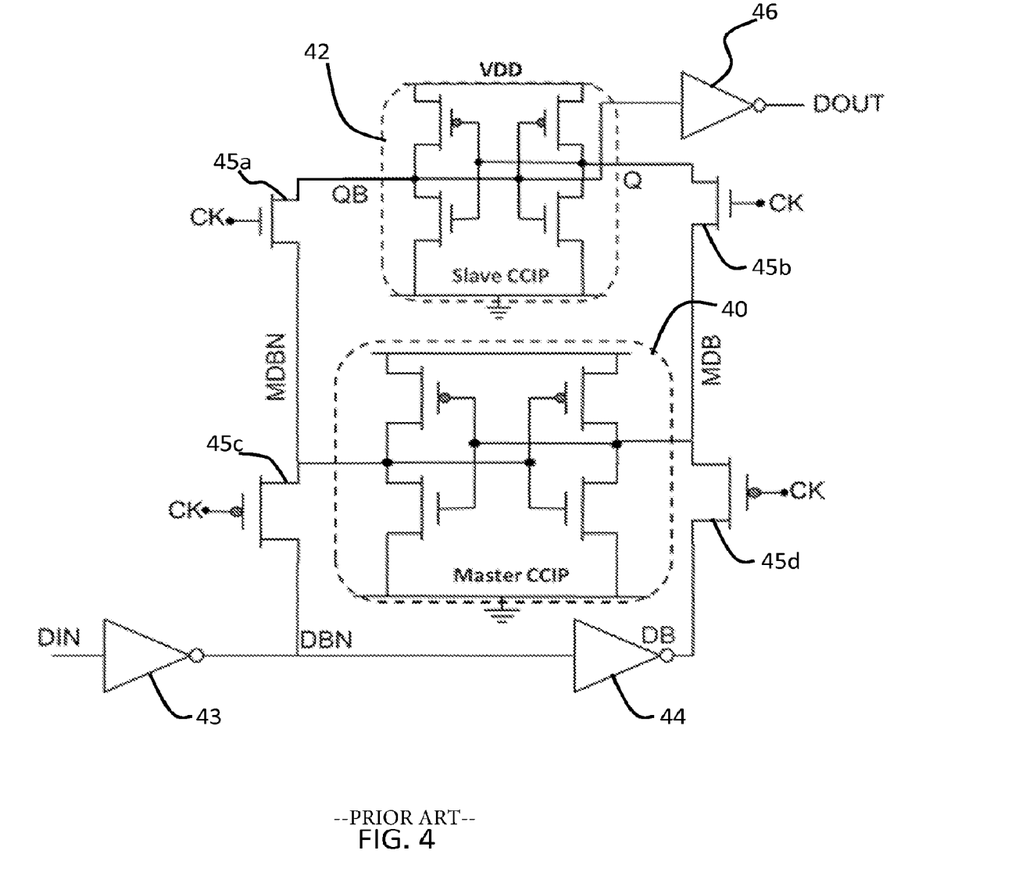
FIG. 4 shows a third known master-slave flip flop design.

Low power conditional clocking flip-flops which avoid energy-intensive precharge are based on a differential topology as shown in FIG. 4, which shows a differential SRAM cell based master slave flip-flop topology.

The circuit comprises a master memory cell 40 and a slave memory cell 42. Each memory cell is in the form of a cross coupled inverter pair (CCIP).

The operation of this type of circuit is for example described in U.S. Pat. No. 7,456,669.

The input to the circuit DIN is inverted by first data inverter 43 to form an inverted input DBN, and inverted again by a second data inverter 44 to form a non-inverted input DB. By non-inverted in this description and claims is meant "having the same phase", since DB is in fact a double-inverted version of the input. These two data signals DB and DBN are internal data signals.

The clock input controls a set of transistors which either couple the internal data signals to the master memory cell 40, or else couple the master memory cell data to the slave memory cell 42.

The set of transistors comprise a first, NMOS, transistor 45a for coupling the inputs of the two memory cells, a second, NMOS, transistor 45b for coupling the outputs of the two memory cells, a third, PMOS, transistor 45c for coupling the inverted input DBN to the input of the master cell 40 and a fourth, PMOS, transistor 45d for coupling the non-inverted input DB to the output of the master cell 40.

For one phase of the clock input (CK low in this example), the two internal data signals are coupled to the master memory cell 40, and for the other phase (CK high in this example), the master and slave cells are coupled together by internal nodes MDBN and MDB. The input to the slave cell is named QB and the output of the slave cell is named Q. Signal QB is inverted to derive the circuit output DOUT.

The internal nodes (DBN, DB, MDBN, MDB, QB and Q) are discharged or charged only when the input and output data are different for the consecutive clock cycles.

The sampling operation basically involves writing into the two pairs of cross coupled inverters (master CCIP 40 and slave CCIP 42). The input data is transparent to the master CCIP 40 during the low phase of the clock (before the rising edge of the clock). On the rising edge of the clock the data is written into the slave CCIP 42 by the master CCIP 40.

However, when the data value stored in the slave CCIP 42 is different to the value of the master CCIP 40, there is a high risk of master CCIP data corruption by the data value stored in the slave CCIP.

This makes the circuit susceptible to process variations. In order to avoid this data coupling and to overpower the data value stored in the slave CCIP, the master CCIP is sized to be larger than the slave CCIP (as schematically shown in FIG. 4). This oversizing increases the power consumption.

To address this issue, an adaptive coupling based master slave flip-flop topology has been proposed, in Chen Kong Teh et. al., "A 77% Energy-Saving 22-Transistor Single-Phase Clocking D flip-flop with Adaptive Coupling configuration in 40 nm CMOS", Proc. Of IEEE ISSCC 2011, pp. 338-339.

Figure 5:
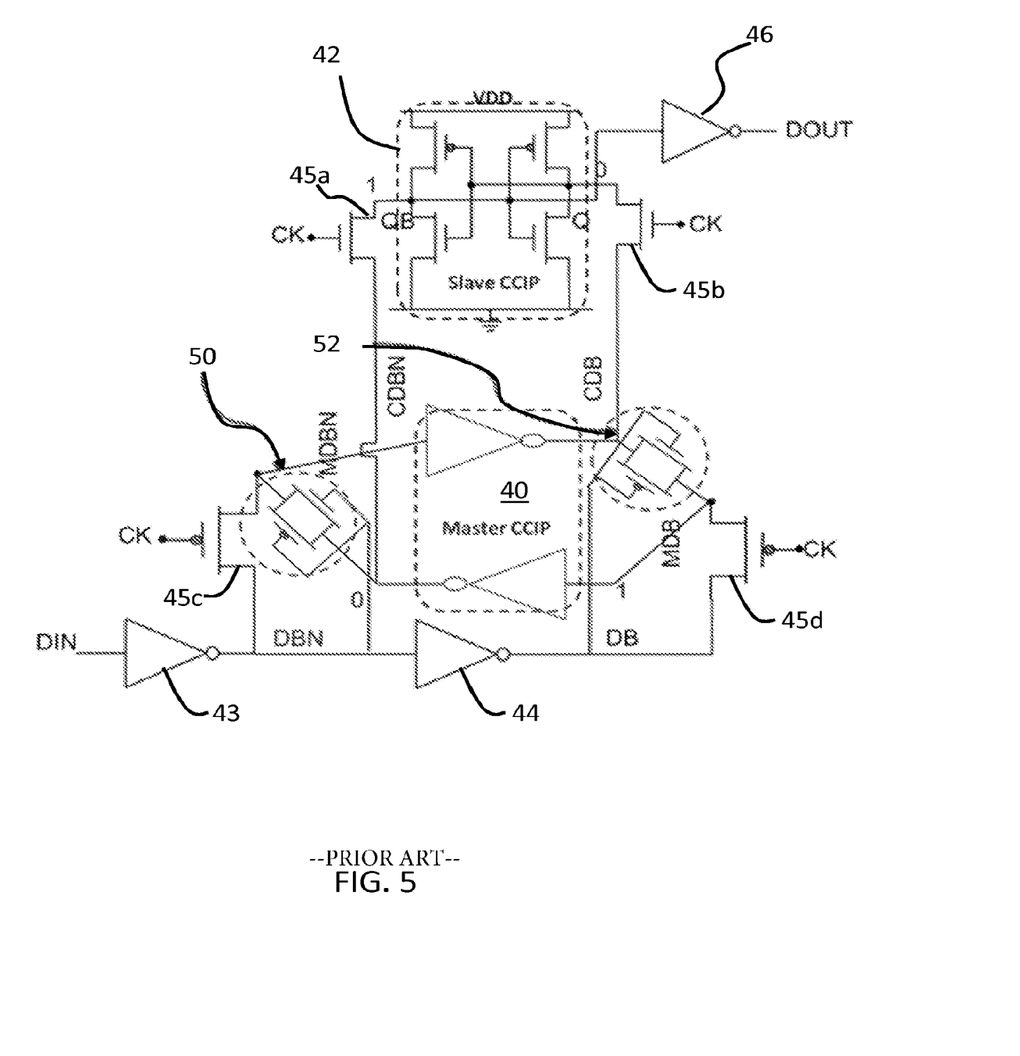
FIG. 5 shows a fourth known master-slave flip flop design.

FIG. 5 shows this circuit design.

The adaptive-coupling based topology introduces two additional adaptive coupled elements 50,52. The configuration weakens the impact of the state-retention coupling when the input state (the value stored in master CCIP 40) is different to the internal state (the slave CCIP value to be written).

This results in easy transition and enhances the variability resilience.

Each adaptive-coupling element consists of one PMOS and one NMOS, configured in parallel, and the gates are controlled by the same data signal. If the gate level for the NMOS is low (DBN node is low, DB node is high), the PMOS is switched on, and the NMOS is switched off, weakening the impact of rising node CDBN in flipping the value stored in the master CCIP 40. The basic idea of this circuit is to limit the impact of the slave CCIP data coupling on the master CCIP.

The additional circuit elements introduce undesirable delays into the circuit.

The invention is defined by the claims.

According to the invention, there is provided a latch circuit, comprising:
 a master circuit comprising a cross coupled pair of inverters;
 a slave circuit comprising a cross coupled pair of inverters;
 a data input terminal;
 data output terminal;
 an inverter arrangement for inverting the data at the data input terminal, to derive an inverted and a non-inverted version of the data input;
 a first switching arrangement for switching one of the inverted and non-inverted versions of the data input to the input of the master circuit and for switching the other one of the inverted and non-inverted versions of the data input to the output of the master circuit; and
 a second switching arrangement for coupling the inputs of the master and slave circuits and for coupling the outputs of the master and slave circuits, the first and second switching circuits being clocked by an input clock,
 wherein the inverters of the slave circuit are coupled to a high voltage rail and a low voltage rail, wherein for each of the two inverters, the coupling to one of the voltage rails is through a resistive element.

This circuit provides a resistive connection of the slave circuit inverters to one of the voltage lines. This is used to create a voltage drop which in turn lowers a transistor source voltage, and thereby reduces the strength of the slave circuit. This circuit design avoids the need for an internal clock-buffer. The circuit can also use single phase clocking, and therefore does not need internal clock signal inversion. There is no need for a precharge stage (as required by a sense amplifier based flip flop, for example as disclosed in U.S. Pat. No. 7,557,630). The circuit of the invention can be implemented with low power, with no dynamic power consumption for redundant transitions when the input and the output data signal is same. The hold time problem discussed above is also avoided.

By resistive element is meant a component which deliberately has a higher resistance a conductive connecting track. Preferably, the resistive element comprises a diode-connected transistor.

The resistive element can comprise a diode-connected NMOS transistor connected between the high voltage rail and the respective inverter.

Preferably, each inverter of the slave circuit comprises an NMOS and PMOS transistor in series with connected gates at their input. The resistive element is preferably for reducing the PMOS source voltage, thereby reducing the strength of the PMOS transistors in holding their data value compared to the strength of transistors forming the second switching arrangement.

For example, the first switching arrangement can comprise transistors of a first polarity type (e.g. PMOS), and the second switching arrangement comprises transistors of a second, opposite, polarity type (e.g. NMOS). For NMOS transistors, these are easily able to write into the slave circuit by virtue of the reduced PMOS source voltage of the inverter circuit. The first switching arrangement preferably comprises a first PMOS transistor between the inverted version of the input and the input to the master circuit, and a second PMOS transistor between the non-inverted version of the input and the output of the master circuit.

The non-inverted version of the input can comprise a double-inverted version of the input, and wherein the inverter arrangement comprises first and second inverters in series to create the inverted and double-inverted signals. The output to the data output terminal can comprises an inverted version of the input to the slave circuit.

BRIEF DESCRIPTION OF DRAWINGS

Examples of the invention will now be described in detail with reference to the accompanying drawings, in which.

The invention provides a latch circuit based on a master-slave cross-coupled inverter pair configuration. The inverters of the slave circuit are coupled to a high voltage rail and a low voltage rail, wherein for each of the two inverters of the slave circuit inverter pair, the coupling to one of the voltage rails is through a resistive element. This circuit design avoids the need for an internal clock-buffer and enables single phase clocking, and therefore does not need internal clock signal inversion. The circuit can be implemented with low power, with no dynamic power consumption for redundant transitions when the input and the output data signal is same.

The invention relates to a differential master-slave cross coupled inverter to implement a latch circuit, i.e. a flip flop topology. This architecture resembles two cascaded SRAM 6 transistor bit cells. The resistive elements can be implemented as diode-connected NMOS transistors in the slave cross coupled inverter pair. These weaken the PMOS transistors holding on the data value. The transistor count is less compared to the existing low-power flip-flops.

Figure 6:
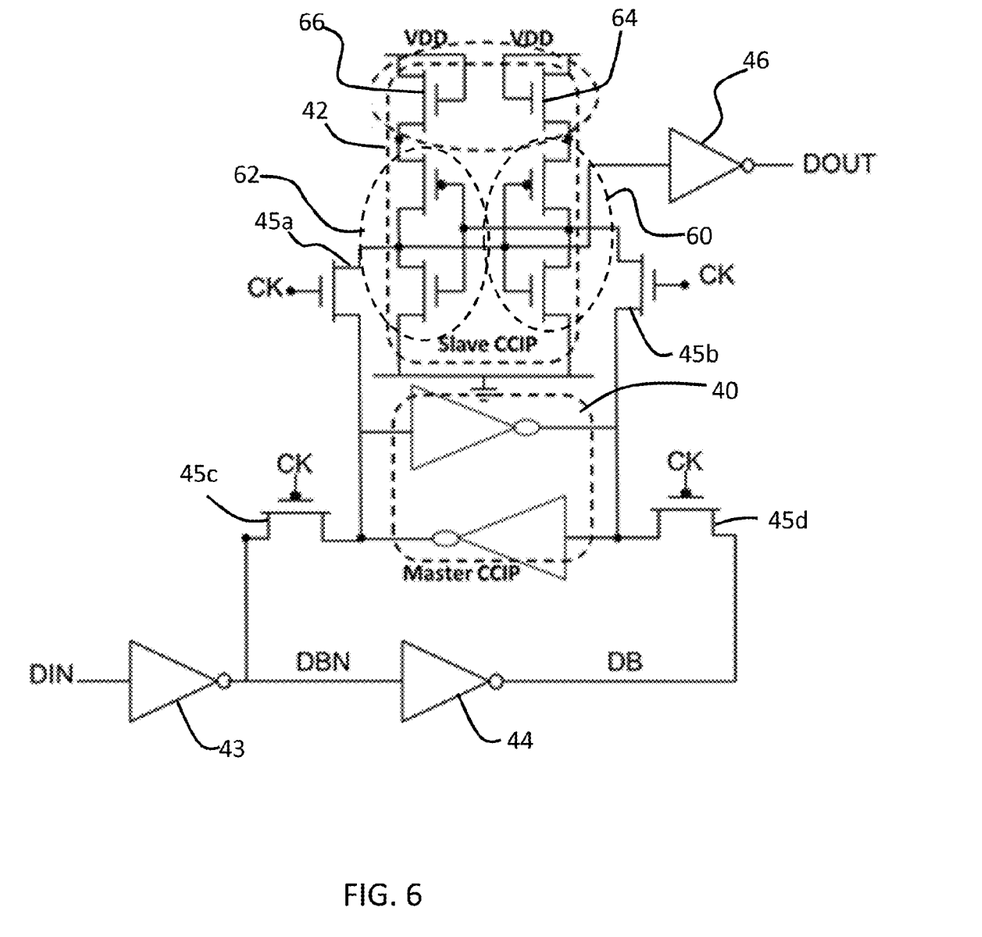
FIG. 6 shows a first example of flip flop design of the invention.

FIG. 6 shows an example of circuit of the invention. The circuit is based on the master slave circuit of FIG. 4, and the same references are used.

The difference resides in the design of the slave cross coupled inverter pair circuit 42. The slave circuit has an input inverter 60 and an output inverter 62. Each of these comprises a PMOS transistor coupled to the high voltage rail and an NMOS transistor connected to the low voltage rail. The NMOS and PMOS transistors are in series with connected gates at their input, and the output is taken from the connection point between the transistors (their drains).

However, unlike the circuit of FIG. 5, the source of the top PMOS transistor of each inverter does not connect directly to the high voltage rail VDD but is connected through a respective resistive element 64, 66.

Each resistive element 64,66 comprises a diode-connected transistor, in particular a diode-connected NMOS transistor connected between the high voltage rail VDD and the respective inverter PMOS transistor.

The PMOS transistors 45c, 45d together comprise a first switching arrangement (one between the inverted version of the input and the input to the master circuit, and the other between the non-inverted version of the input and the output of the master circuit) for switching the differential input to the master CCIP 40. The NMOS transistors 45a, 45b together define a second switching arrangement for coupling the inputs of the master and slave circuits and for coupling the outputs of the master and slave circuits. These can be considered to be NMOS pass transistors which pass data from the master to slave.

The basic problem to be solved with the known differential master-slave topology of FIG. 4 is to ensure successful overwriting of the slave CCIP data. This is like a SRAM 6 transistor cell WRITE operation.

The slave CCIP with clocked NMOS pass transistors act as a 6 transistor cell, and the master CCIP is a WRITE sense amplifier structure.

The slave data coupling can result in flipping the data value latched in the master CCIP resulting in an erroneous data sampling. The traditional approach of oversizing the master CCIP prevents this at the cost of increased area and power consumption overhead.

The topology of FIG. 6 is based on the concept of enhancing the writeability of the Slave CCIP 42. The diode connected NMOS transistors 64,66 introduced in the slave CCIP lower the source voltage of the PMOS transistors of the cross coupled inverter pair. This reduces the strength of PMOS transistors in holding the data value compared to the strength of the pass NMOS transistors 45a,45b (turned ON by the high phase of CK) which easily WRITES in the data value of the master CCIP 40 into the slave CCIP 42.

The clock to output delay with this topology is also faster compared to the circuit of FIG. 5, as that circuit facilitates the WRITE operation by preventing the data flip in the master CCIP 40 rather than accelerating the WRITE operation. The data output inverter 46 can be sized to reduce the rise to fall delay caused by the lowered source voltage level of slave cross coupled pair of inverters.

The table below shows simulation Results based on 40 nm technology, VDD=1.1V, Temp 27° C. and the nominal process corner.

| Flip-flop topology | Conventional Differential FF | FIG. 5 | FIG. 6 |
|---|---|---|---|
| Average Current (u A) | 7.16 u A | 3.43 u A | 2.47 u A |
| TC-Q delay (ps) | 47.12 | 56.57 | 47.05 |
| Tsetup (ps) | 108 | 80 | 80 |
| Thold (ps) | −50 | −30 | −35 |

Figure 7:
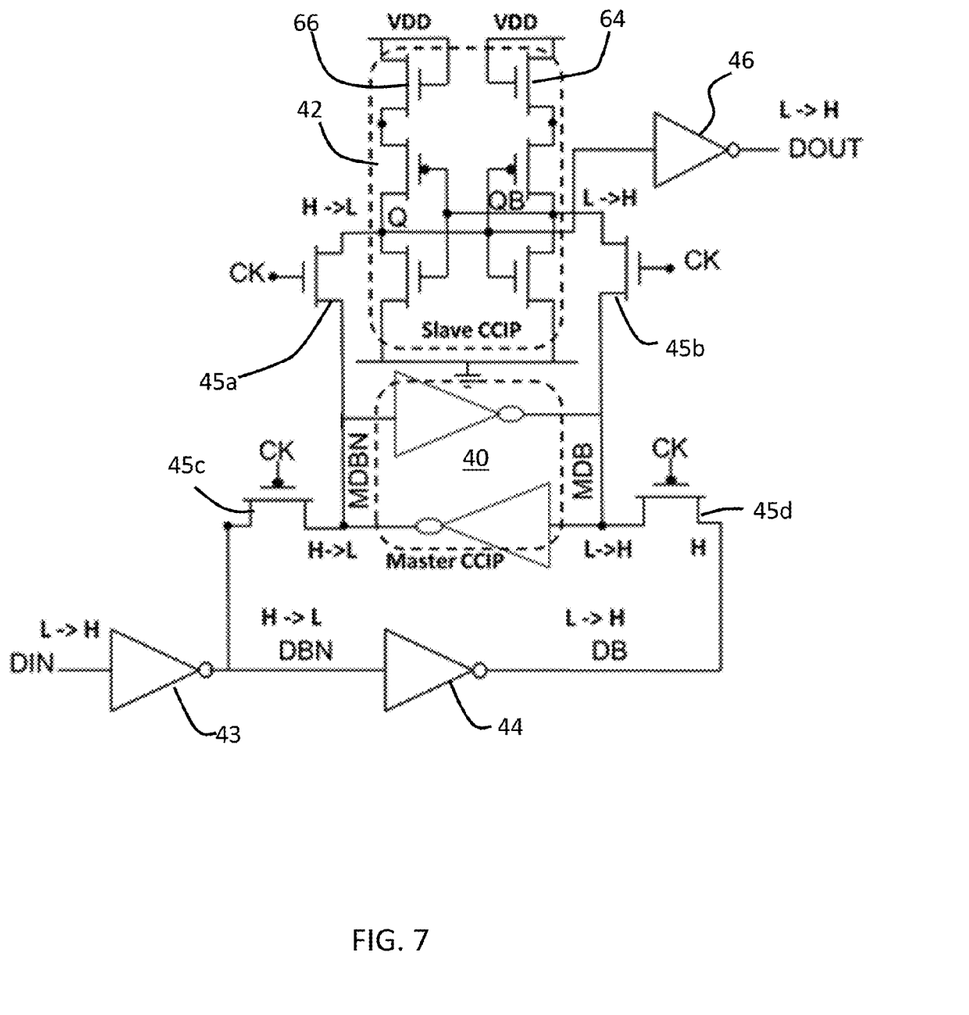
FIG. 7 is used to explain the operation of the circuit of FIG. 6.
Figure 8:
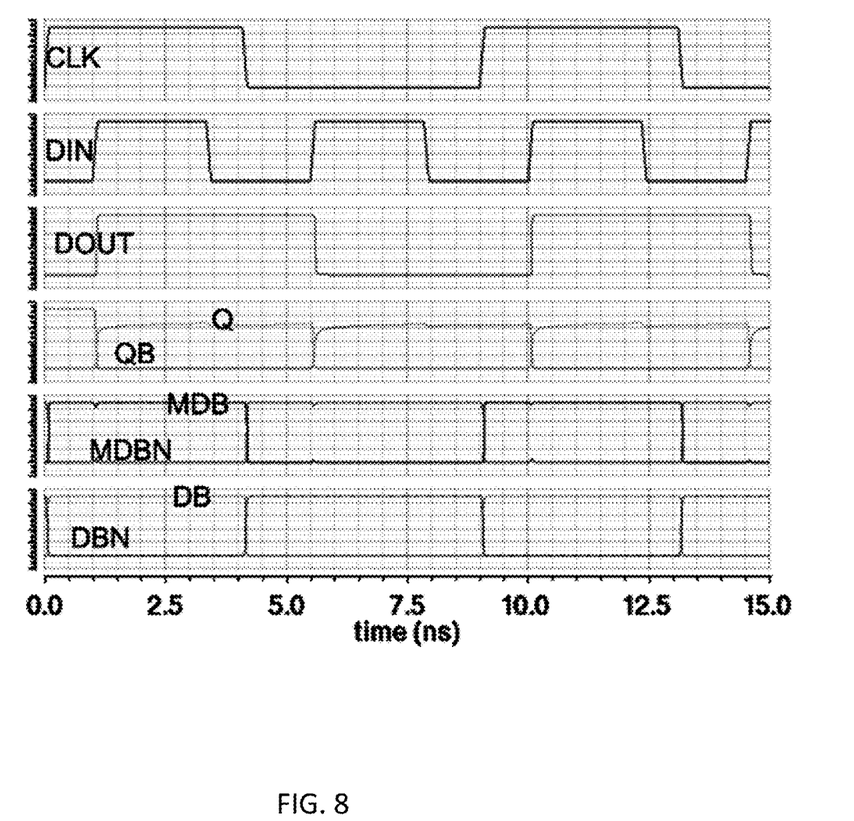
FIG. 8 is a timing diagram to explain the operation of the circuit of FIG. 6.

FIG. 7 shows the circuit of FIG. 6 with additional node names, used in the timing diagram of FIG. 8. It also shows the effect of a rising edge at the input.

In a first phase, the input DIN is written to the master CCIP 40 and in a second phase, the master CCIP data is written in the slave SSIP (on the rising edge of the clock).

FIG. 8 shows the clock input CLK, the data input DIN and the data output DOUT. It also shows the input Q and inverted input QB to the slave cell 42, and the input and inverted input MDBN,MDB to the master cell 40. The inverted input DBN and the double-inverted input DB are also shown.

This circuit of the invention can be used in a wide range of circuits, for example in low power cryptographic system on chip designs.

The invention enables a reduction in the current spikes, which enhances the resilience against side channel attacks, as well as a reduction in power consumption.

The flip flop topology when implemented in 40 nm CMOS technology, for the comparable setup and hold time, results in 28% reduction in the power consumption and reduces the clock to output delay by 17% operating at VDD=1.1V, 27° C. and nominal process corner.

In the example above, the resistive element is provided on the high voltage rail side of the circuit. The resistive element can instead be at the ground side. It can then function to raise the source voltage rather than dropping the drain voltage.

The resistance element is shown as a diode-connected transistor in the example above. However, the resistances can be implemented in other ways, for example using polysilicon resistors.

The example above is also based on a MOS transistor circuit. However, an equivalent circuit function can be achieved using other transistor technologies, such as bipolar junction transistors. Similarly, the invention can be applied to FinFET and FDSOI (fully depleted silicon on insulator MOSFET) devices.

The example above makes use of an inverted input DBN and a double inverted input DB. Instead, the original input DIN and a single inverted version DBN can be used. This results in a higher power consumption, so is only suitable where power consumption is not an issue.

The example above is for a D-type rising edge triggered flip flop. The invention can be applied to all master slave flip flop designs.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A latch circuit, comprising:
   a master circuit comprising a cross coupled pair of inverters;
   a slave circuit comprising a cross coupled pair of inverters;
   a data input terminal;
   a data output terminal;
   an inverter arrangement for inverting the data at the data input terminal, to derive an inverted and a non-inverted version of the data input;
   a first switching arrangement for switching one of the inverted and non-inverted versions of the data input terminal to the input of the master circuit and for switching the other one of the inverted and non-inverted versions of the data input to the output of the master circuit; and
   a second switching arrangement for coupling the inputs of the master and slave circuits and for coupling the outputs of the master and slave circuits, the first and second switching arrangements being clocked by an input clock;
   wherein the cross coupled pair of inverters of the slave circuit are coupled to a high voltage rail and a low voltage rail, wherein for each of the cross coupled pair of inverters of the slave circuit, the coupling to the high voltage rail is through a resistive element, wherein the resistive element comprises a diode-connected NMOS transistor connected between the high voltage rail and the respective inverter, and wherein a gate terminal of the diode-connected NMOS transistor is connected to the high voltage rail.

2. A circuit as claimed claim 1, wherein each inverter of the slave circuit comprises NMOS and PMOS transistors in series with connected gates at their input.

3. A circuit as claimed in claim 1, wherein the first switching arrangement comprises transistors of a first polarity type, and the second switching arrangement comprises transistors of a second, opposite, polarity type.

4. A circuit as claimed in claim 3, wherein the first switching arrangement comprises PMOS transistors and the second switching arrangement comprises NMOS transistors.

5. A circuit as claimed in claim 4, wherein the first switching arrangement comprises a first PMOS transistor between the inverted version of the input and the input to the master circuit, and a second PMOS transistor between the non-inverted version of the input and the output of the master circuit.

6. A circuit as claimed in claim 5, wherein the non-inverted version of the input comprises a double-inverted version of the data input, and wherein the inverter arrangement comprises first and second inverters in series.

7. A circuit as claimed in claim 1, wherein an output to the data output terminal comprises an inverted version of the input to the slave circuit.

8. A circuit as claimed in claim 7, comprising an output inverter for inverting the input to the slave circuit to derive the output.

* * * * *